US007157375B2

United States Patent
Campbell et al.

(10) Patent No.: US 7,157,375 B2
(45) Date of Patent: Jan. 2, 2007

(54) METHODS OF DOWNSTREAM MICROWAVE PHOTORESIST REMOVAL AND VIA CLEAN, PARTICULARLY FOLLOWING STOP-ON TIN ETCHING

(75) Inventors: Timothy Scott Campbell, Gotha, FL (US); Kelly Hinckley, Orlando, FL (US); Paul B. Murphey, Winter Garden, FL (US); Daniel M. Oman, Orlando, FL (US); Paul Edward Wheeler, Clermont, FL (US)

(73) Assignee: Agere Systems, Inc., Allentown, PA (US)

( * ) Notice: Subject to any disclaimer, the term of this patent is extended or adjusted under 35 U.S.C. 154(b) by 154 days.

(21) Appl. No.: 10/925,555

(22) Filed: Aug. 25, 2004

(65) Prior Publication Data
US 2006/0043062 A1    Mar. 2, 2006

(51) Int. Cl.
H01L 21/302    (2006.01)

(52) U.S. Cl. ............ 438/689; 438/637; 438/726; 134/1.2; 134/1.3; 435/283.1

(58) Field of Classification Search ............ 438/689
See application file for complete search history.

(56) References Cited

U.S. PATENT DOCUMENTS

| | | | |
|---|---|---|---|
| 4,875,989 A * | 10/1989 | Davis et al. ............ 204/298.33 |
| 5,587,039 A | 12/1996 | Salimian et al. | |
| 5,719,089 A * | 2/1998 | Cherng et al. .............. 438/637 |
| 5,908,319 A | 6/1999 | Xu et al. | |
| 5,955,382 A * | 9/1999 | Yamauchi et al. .......... 438/726 |
| 6,617,152 B1 * | 9/2003 | Bryhan et al. ............ 435/283.1 |
| 6,805,139 B1 * | 10/2004 | Savas et al. ................. 134/1.3 |
| 2002/0124867 A1 * | 9/2002 | Kim et al. .................... 134/1.2 |

FOREIGN PATENT DOCUMENTS

JP    62224932    * 10/1987

OTHER PUBLICATIONS

Boumerzoug et al.; A Dry Process for Polymer Sidewall Residue After Via-Hole Etching; 2000 IEEE/SEMI Advanced Semiconductor Manufacturing Conference; 7803-5921-6/00/2000 IEEE pp. 281-286.*
Han Xu; Manufacturing Qualification of Plasma Wafer Cleaning Processes for FEOL and BEOL Applications; PEUG 2003.*
Kimberley Koretchko; Solvent Free post Metal Etch Veil Removal Proces Development; Department of Materials Science and Engineering at North Carolina State University, Raliegh; 2002.*

* cited by examiner

Primary Examiner—Nadine Norton
Assistant Examiner—Patricia A. George

(57) ABSTRACT

A process for photoresist layer removal from a semiconductor wafer comprises exposing at relatively high temperature the wafer to an RIE-free microwave-energy-generated plasma of a primary gas mixture, the exposing causing photoresist removal such as by ashing. The method also comprises determining an endpoint to the removal by a determined change in the visible light emanating from a chamber containing the wafer.

A multi-step process of the present invention comprises the above method and a preliminary RIE-free microwave-energy-generated plasma that solubilizes polymer on walls of vias of the wafer. This multi-step process also comprises, following the exposing step, a cooling step, a cooling step with a temperature check, and a deglazing step. The deglazing step also uses an RIE-free microwave-energy-generated plasma. Specific gas mixtures for the respective plasmas are exemplified. Other embodiments of methods of the present invention are comprised of less steps, or a consolidation of such steps.

10 Claims, 1 Drawing Sheet

METHODS OF DOWNSTREAM MICROWAVE PHOTORESIST REMOVAL AND VIA CLEAN, PARTICULARLY FOLLOWING STOP-ON TIN ETCHING

FIELD OF INVENTION

This invention relates to microwave-generated plasma methods for dry etching and dry stripping in semiconductor wafer manufacture, such as photoresist removal with via side wall polymer treatment.

BACKGROUND OF THE INVENTION

Numerous methods exist in semiconductor manufacture for chemical etching and for cleaning of semiconductor wafers. One category of such methods is chemical solvent cleaning. However, it is recognized in the art that the use of environmentally hazardous chemicals, such as solvents used in chemical solvent cleaning, is disfavored. Thus, methods other than chemical solvent cleaning have been developed.

Key among non-solvent methods is the use of plasmas that form reactive ionized molecules that chemically etch a wafer. Plasma-based methods are used, for example, for etching and for post-process cleaning. One example of post-process cleaning is the stripping of photoresist following etching processes. Among these cleaning methods are those that utilize a reactive ion etching ("RIE") process at low temperature, either by itself or in combination with a microwave source. An RIE process combines plasma and ion beam to achieve removal of a surface layer. For example, U.S. Pat. No. 5,908,319 discloses methods in which a microwave source associated with a gas inlet forms a reactive gas comprising free radicals. A radio frequency ("RF") source for the RIE, positioned closer to a wafer being treated, ionizes the free radicals of the microwave plasma. The resulting RIE ions contact the wafer to achieve a desired reaction. This reference and all patents, patent applications, patent publications, and all other publications cited herein are incorporated by reference to the same extent as if each individual publication or patent application was specifically and individually set forth in its entirety.

Despite common use of RIE processes for photoresist stripping, it is known that the use of an RF plasma source for the RIE can lead to plasma damage. Such damage is known in the art, and is discussed in "Microchip Fabrication," $3^{rd}$ Edition, Peter Van Zant, pp. 269, 277; 1997 (which is incorporated by reference for this and other aspects of wafer fabrication). Depending on the concentrations and energy levels of energetic atoms, radicals, ions, electrons and photons in a plasma, plasma-caused damage may include surface leakage, damage to silicon, degradation of films (especially oxides), and changes in electrical parameters.

For example, a region of high voltage plasma bombards excess ions to the wafer surface, which can result in charging of exposed metal conductors. If the total surface area of conductors connecting to a gate is too large, the RIE plasma-induced ions striking this surface area then lead to a current discharge through the relatively thin gate oxide, which can lead to permanent damage.

While plasma damage generally is recognized to be of a greater concern during etching, where metal conductors ("antennas") are exposed for relatively long periods compared to, for instance, plasma enhanced deposition, it has been learned that RIE plasma also is problematic in photoresist removal and via clean steps.

Regarding the latter, there is a need for a non-chemical solvent, plasma cleaning process that is characterized by less plasma damage to the wafer than is associated with RIE plasma. The methods of the present invention meet this need, and are particularly suited for use following formation of vias.

SUMMARY OF INVENTION

The present invention teaches methods of photoresist removal, and of photoresist removal in combination with via cleaning. A method for photoresist layer removal from a semiconductor wafer, such as a wafer having an exposed TiN layer, comprises exposing at relatively high temperature the wafer to a microwave-energy-generated plasma without RF energy, and thereafter determining an endpoint to the removal, such as by detecting a change in the visible light emanating from a chamber containing the wafer. The exposing to the plasma removes photoresist by ashing.

More particularly, a microwave power source forms a plasma field at a point after a gas inlet to a chamber containing a wafer being processed. Downstream of this area of formation of plasma, reactive plasma species, such as ions, react with layers and features of the exposed wafer surface, in particular the photoresist.

Advantageously, the plasma is formed using only microwave energy, i.e., without RF energy. It has been learned that this improves product quality, at least in part by reducing plasma damage. Also advantageously, some embodiments of the present invention replace or eliminate two common steps, one being longer duration, lower temperature RIE plasma photoresist removal, and the other being solvent cleaning.

In certain embodiments, a photoresist removal method in combination with a via cleaning method follows via etching. For example, according to one embodiment of the present invention five general steps follow a Stop-On-TiN Via Etch process. These five general steps are: via sidewall clean; microwave plasma photoresist strip; cooling; cooling with temperature check, and deglazing. These steps provide for solubilizing polymer present on the via side walls to allow for subsequent water rinsing, ashing the photoresist, and removing, by deglazing, any oxide layer that may have formed in the bottom of the vias, where TiN is layered. This embodiment eliminates the need for a longer, low-temperature RIE photoresist strip step.

Other aspects, advantages and objects of the present invention are provided in the following description, which is to be considered with the appended drawings.

DETAILED DESCRIPTION OF THE INVENTION

Figure 1:
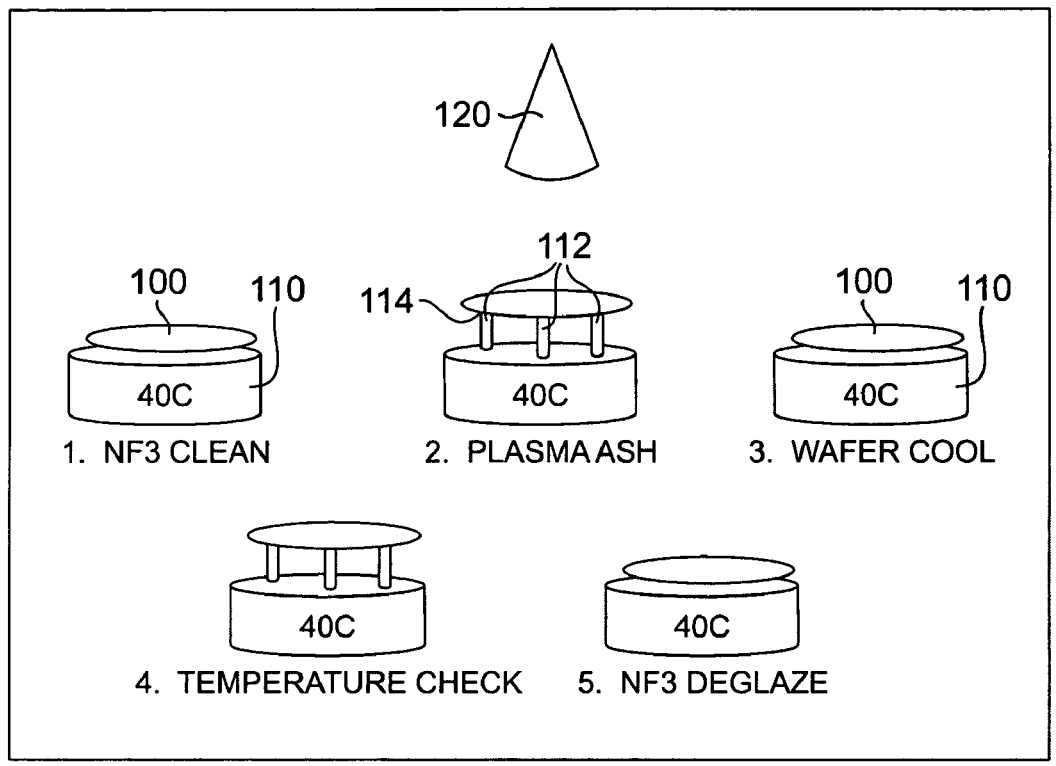
FIG. 1 provides a pictorial representation of five steps of one embodiment of the present invention.

The apparatuses, methods, and systems of the present invention are better understood by referring to the specific embodiments described herein, including reference to the tables and appended figures.

In one embodiment of the present invention, a downstream microwave plasma is utilized to remove photoresist that remains on the wafer surface following photolithography patterning. A wafer at a relatively high temperature is exposed to a microwave-energy-generated plasma. Then an end point is determined, after which the exposure to plasma at relatively high temperature ends. By "relatively high temperature" is meant a temperature over about 215 degrees Celsius ("° C.") and lower than a temperature that, during the exposure period, damages components of a particular wafer. In one embodiment, a desired temperature range is between about 230 and 270° C.

For example, a downstream microwave-generated plasma is formed from an oxygen-containing mixture of gas. A wafer is exposed to relatively high temperature, for instance between 230 and 270° C., and the reactive oxygen of the plasma contacts the photoresist on the wafer surface. This results in oxidation and ashing of the photoresist, which in the art is a form of stripping the photoresist layer. Accordingly, the plasma used in this step is termed a "stripping plasma," and the step is referred to as a stripping step, an ashing step, or more fully as a "high temperature downstream microwave photoresist strip."

This process continues until an endpoint is detected. For instance, an endpoint is detected by the changes in visible light emanating from the chamber. During the removal of the carbon-based photoresist, when carbon is in the space above the wafer, the carbon/oxygen reaction prevents the $O_2$ glow discharge. As the photoresist stripping is ending, $O_2$ glow discharge increases, increasing the level of light detected at the end point detector. Accordingly, the level of light indicates the presence, or absence, of carbon reactants in plasma-generated reactive oxygen. When the light level crosses a specified value and the rate of change levels off, an endpoint is reached.

Based on this endpoint determination, the exposure of the wafer to the elevated temperature and the microwave-generated plasma ceases. Alternatively, the exposure of the wafer to the elevated temperature and the microwave-generated plasma is continued for a specified period in order to ensure complete removal of the photoresist. For example, a 30-second continued exposure after endpoint determination has been utilized with success. One reason for such an over-ashing time period is to ensure removal of photoresist that may have been baked on during the etch process, during which temperatures can reach as high as about 200° C.

Advantageously, particularly with regard to reduction of plasma-induced wafer damage, the above-described plasma stripping in the presence of microwave energy is conducted without RF energy.

It is further noted that a preliminary step may be introduced before the above-described exposing to the stripping plasma. This preliminary step is exposing the wafer to microwave-energy-generated plasma from a gas mixture comprising oxygen and an amount of a fluorine-containing gas sufficient to water-solubilize polymer on side walls of etched features in the wafer. Accordingly, this step is termed a solubilizing step, using what is termed as a solubilizing plasma. In certain embodiments, this solubilizing step is conducted while the wafer is maintained within a standard process temperature range, i.e., at a temperature lower than "relatively high temperature." Without being limiting, one example of a "standard temperature range" is between about 30 and 50° C.

Further as to this preliminary step, it is recognized that polymer may deposit on side walls of vias during etching. Such polymer comes from the photoresist. If not removed or modified prior to a subsequent high temperature oxygen plasma treatment, such side wall polymer may become difficult to remove. In order to address this, in many such embodiments a side wall polymer solubilization step, such as described above, using a solubilizing plasma, is introduced before the stripping step.

For instance, a solubilizing microwave-generated plasma is formed with a gas mixture comprising oxygen, a fluorine-containing compound, and a nitrogen-containing compound. Then, through use of a vacuum pump drawing gas from a side of the wafer opposite the plasma source, the plasma contacts the wafer at relatively low temperature. More particularly, an $NF_3/N_2H_2/O_2$ downstream plasma is used to fluorinate the sidewall polymer of a wafer that is maintained at about 30–50° C. In combination with a later water rinse, such as in a separate apparatus designed for that step, this provides for removal of sidewall polymer while not interfering with the stripping step described above.

It is further recognized that the exposure of a wafer chamber to a gas mixture such as $NF_3/N_2H_2/O_2$ affords an additional, unexpected benefit. Namely, fluorine passivates the sapphire surface of the chamber and blocks the reaction of oxygen with the material in such surface.

Further, it is recognized that oxides form on metal surfaces at the bottom of vias in the wafer during the above described ashing step. Removal of such oxides is desirable in order to prepare the metal surfaces for subsequent steps. Accordingly, a method of the present invention also may include a deglazing step. For instance, $NF_3$ is introduced into a chamber with flows of $N_2H_2$ and $O_2$. One combination of such gases is shown in Table 1 for step 5, while it is apparent that other percentage mixtures may be employed as is known to those skilled in the art, or upon routine experimentation in accordance with the teachings herein. In the referenced step 5, a microwave source generates a plasma, and this acts to deglaze, or remove the oxide layer from, a TiN layer at the bottom of vias on the wafer.

Depending on the requirements of the processor, one or both of the polymer solubilization and the deglaze steps may be combined with the plasma ashing process to achieve the noted process objectives. As needed, cooling and temperature check steps may be added to assure a desired reaction temperature for each step. Also, it is noted that the terms "solubilizing plasma," "stripping plasma," and "deglazing plasma" have been adopted for ease in identifying the steps in which these are used. The actual compositions of gas mixtures to generate these three plasmas may be similar or identical, and it is the use in a particular step that is relevant in distinguishing these so-identified plasmas.

Table 1 and FIG. 1 provide data and visual representations of one embodiment in which the side wall polymer solubilization, ashing, and deglazing steps are combined into a multi-step method. This example is meant to be illustrative and not limiting.

TABLE 1

Details of a Method of Stop-On-TiN Microwave Dry Via Clean

| | Step Number: | | | | |
|---|---|---|---|---|---|
| | 1 | 2 | 3 | 4 | 5 |
| Timed Recipe (y/n) | Yes | No | Yes | Yes | Yes |
| Step time, sec | 20 | NA | 25 | 15 | 10 |
| End Point Recipe (y/n) | No | Yes | No | No | No |
| Overetch Time, sec | NA | 30 | NA | NA | NA |
| Gas Stabilization, sec | 5 | 5 | 0 | 0 | 0 |
| Lamp Temp, ° C. | NA | 250 | NA | 120 | NA |
| Heater temp, ° C. | 39 | NA | 39 | NA | 39 |
| Pin position | Down | Up | Down | Up | Down |

TABLE 1-continued

Details of a Method of Stop-On-TiN Microwave Dry Via Clean

| | Step Number: | | | | |
|---|---|---|---|---|---|
| | 1 | 2 | 3 | 4 | 5 |
| Microwave On/Off | On | On | Off | Off | On |
| Microwave Power, watts | 1000 | 1400 | 0 | 0 | 1000 |
| Base pressure, mTorr | 1000 | 2000 | 1000 | 1000 | 1000 |
| NF3, sccm | 100 | 0 | 0 | 100 | 100 |
| O2, sccm | 1000 | 1800 | 1000 | 1000 | 1000 |
| N2, sccm | 0 | 400 | 0 | 0 | 0 |

The five general steps defined in Table 1 are presented pictorially in FIG. 1. It is noted that each of these general steps as depicted may be considered to involve more than one distinct substep. However, the method may be practiced by consolidation or elimination of certain substeps, as would be clear to one skilled in the art (for instance, certain substeps of the cooling steps 3 and 4). The five general steps are characterized as follows, and then described in greater detail herein:

1. Via sidewall clean (polymer solubilization) using a solubilizing plasma;
2. Microwave plasma photoresist strip using a stripping plasma;
3. Cooling;
4. Cooling with Temperature Check; and
5. Deglazing using a deglazing plasma.

In general step 1, wafer 100 is in contact with platen 110. A 1,000 watt microwave source (not shown) generates an $NF_3/N_2H_2/O_2$ downstream plasma that is used to fluorinate the sidewall polymer. This renders the sidewall polymer (not visible in FIG. 1) water soluble, and therefore amenable to removal during a subsequent water rinse (not one of the above five steps). The heated platen 110 is set to between about 30 and 50° C., and the contacting wafer 100 thereby also is maintained between about 30 and 50° C. The temperature of the plasma in contact with the wafer 100 also remains within this temperature range. In the embodiment summarized in Table 1, this step lasts about 20 seconds.

As can be gleaned from Table 1 parameters, the first general step actually involves a number of substeps and/or simultaneous actions. For the particular embodiment identified in Table 1, these include: introducing a first gas comprising oxygen and fluorine, wherein the fluorine-containing gas is greater than about 4 percent and less than about 10 percent of the first gas; forming a microwave plasma from the first gas with a microwave source between a point of gas introduction and the wafer in the chamber; and maintaining by heating the wafer at a temperature between about 30 and 50° C.

During the second general step, the wafer 100 is elevated away from platen 110 on pins 112, to be positioned closer to a heating lamp 120. The pins 112 are used to support, and raise and lower, the wafer 100 from the platen 110. The heating lamp 120 is used to achieve a wafer temperature of about 250° C. A temperature probe 114 on one of pins 112 provides data used to maintain the desired wafer temperature. During this general step, a gas comprising oxygen and nitrogen is introduced to the chamber, and is exposed to a 1.4 to 1.7 kilowatt microwave power to form a plasma. The main purpose of this step is to ash the photoresist. An endpoint detection is used to assess removal of the photoresist. The endpoint is determined by the leveling off of light intensity after the light intensity has crossed an established threshold. Then, an over ash for about 30 seconds past the determined endpoint, is used to ensure complete removal of the photoresist.

It is noted that the maintaining of temperature in a particular embodiment such as is depicted in FIG. 1 is by use of an infrared temperature sensor 114 positioned on one of the three pins 112. However, other approaches to monitoring temperature, such as are known to those skilled in the art, alternatively may be employed.

During the third general step, which is cooling the wafer, the wafer 100 is lowered to platen 110 by lowering pins 112. No microwave energy is applied, and a gas flow of $N_2H_2$ and $O_2$, in about equal amounts, is provided. In the summary of an embodiment provided in Table 1, this step lasts about 25 seconds.

During the fourth general step, the temperature is checked while the wafer 100 is elevated away from platen 110 on pins 112. Elevation from platen 110 allows the temperature of the wafer 100, now isolated from platen 110, to be more accurately checked by the temperature probe 114, positioned at the top of on one of pins 112. It is important that, at the end of this step the wafer 100 has a temperature below about 135° C. This prevents excessive TiN removal in the fifth general step. Heating lamp 120 has a nominal turn-off limit of about 120–125° C., but has a set point for turning on at 100° C. Thus, under normal circumstances this lamp does not turn on during this step. As indicated in Table 1, during the fourth general step $NF_3$ is introduced into the gas flow at a relatively low rate compared to the flows of $N_2H_2$ and $O_2$. This is done primarily to stabilize gas flow during this step. Alternatively, a step or sub-step of stabilizing gas flow may be added between this fourth step and the fifth general step, described below. Such a gas-stabilizing step introduces fluorine-containing gas at the concentration that is desired in the fifth general step, providing for stabilization of this flow prior to the fifth general step.

The fifth general step is a deglazing step. $NF_3$ is introduced into the chamber with flows of $N_2H_2$ and $O_2$. A 1,000 watt microwave source downstream of the gas introduction generates a plasma, and this acts to deglaze the TiN layer (not shown) on wafer 100. It is noted that the TiN layer tends to become glazed during general step 2, above. The temperature of the wafer during step 5 is below about 135° C., and in certain embodiments matches the platen temperature, which is between 30 and 50° C.

Thus, as exemplified above, the step 2 relatively high temperature downstream microwave photoresist strip enables a plasma-damage-free post via etch clean process. In this and like embodiments, the overall utility of the relatively high temperature downstream microwave photoresist strip is supported by the addition of steps 3–5: cooling; cooling with temperature check; and deglazing. Further, step 1 provides for solubilization of polymer on side walls of the wafer, so that this polymer may be readily removed in a later water rinse. As indicated above, the functionality of steps 1 and 3–5 may be achieved by consolidation of the steps or by modification of particular substeps, while nonetheless practicing the teachings of the present invention. For example, and not to be limiting, raising and lowering of the wafer to effectuate temperature changes and control, and the use of an overhead heat lamp, may be substituted by other approaches known to those skilled in the art to achieve the desired results without departing from scope of the present invention.

It is noted that in embodiments as described above the microwave-generated plasma is what is known in the art as a downstream plasma. That is, a microwave power source forms a plasma field at a point after a gas inlet communicating with a chamber containing a wafer being processed. Downstream of this area of formation of plasma, reactive plasma species, such as ions, react with layers and features of the exposed wafer surface, in particular the photoresist. The reactive plasma species migrate or are drawn to the wafer area, such as by a vacuum pump drawing from an intake at a side of the wafer opposite an access to that area from a compartment (i.e., a separated chamber, isolated compartment, or region subdivided from the wafer area) in which the microwave source is positioned. In such arrangement of elements, microwave-energy-generated plasma created in a compartment (as defined herein) separate from the wafer is conveyed to the wafer, where it reacts on the wafer components as described herein.

Figure 2:
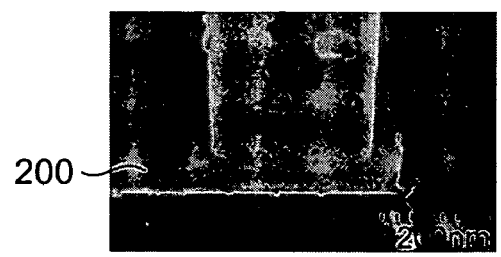
FIG. 2 provides a scanning electron micrograph of a side view of an etched via after cleaning with a method of the present invention.

FIG. 2 provides a scanning electron micrograph of a side view of an etched via after cleaning with a method of the present invention. The loss of the TiN layer, 200, is minimal following the five-step method disclosed above.

The above-described via clean with downstream ash process has been successfully used with dialectrics made of HDP USG (undoped silicon glass), and with FSG/SRO.

Having generally described steps of various embodiments of the invention, the following example describes specific features, parameters, uses and advantages of one embodiment of the present invention.

EXAMPLE 1

Semiconductor wafer samples undergoing fabrication were manufactured and divided into two process groups. The test circuitry includes a Metal-Oxide-Metal (MOM) capacitor between a gate pad and gate oxide. It is believed that if during a process a plasma develops a charge across the MOM capacitor, then the process has the potential to cause plasma damage at the gate oxide. If no charge is developed across the MOM capacitor, it is believed that the process would be free of effects that would cause plasma-derived damage, and the gate oxide would not be damaged during testing.

In this example, one process group used only downstream microwave plasma to strip the photoresist (i.e., via ashing) following TiN-stop etch process. This via ashing process is identified as "Via clean with downstream ash." The other process group used downstream microwave plasma in combination with RIE plasma in the same chamber as the wafers. This group is identified as "Via clean with RIE ash." The two process groups were used to clean vias in the semiconductor wafer samples, and the processes were compared to assess wafer damage from the processes as follows.

The parameter to assess damage is Vt0, which is the change in threshold voltage, Vt, due to an applied stress. Two measurements were made to obtain each Vt value. First, a baseline measurement was made prior to exposing each semiconductor wafer to one of the above two processes. Then, after the respective semiconductor wafer sample was exposed to one of the two processes, a second measurement of Vt was made, and Vt0 was calculated to determine the difference between the second measurement and the first, baseline measurement. Any shift in Vt, as reflected in Vt0, is believed indicative of a change in, and damage to, the gate oxide due to plasma.

Vt0 data is presented in Table 2. The numbers indicated in the columns are Vt0, the difference between baseline and post-stress Vt measurements. The "Via clean with downstream ash" measurements were all near zero whereas the "RIE" measurements ranged farther from zero. The plus and minus swings from zero are due to polarity shifts in plasma potential across the wafer; the absolute value difference from zero is taken to reflect the extent of plasma damage.

TABLE 2

| Identification of Groups | Vt0, "Via clean with RIE ash" group | Vt0, "Via clean with downstream ash" group |
|---|---|---|
| Total Average of 3721~MROM2N1_C1_Vt0 | −0.88 | −0.00031 |
| Total Average of 3725~MROM2N1_C2_Vt0 | −1.06628 | −0.0004 |
| Total Average of 3729~MROM2N1_C3_Vt0 | −1.16778 | −0.00093 |
| Total Average of 3733~MROM2N2_C1_Vt0 | −0.25649 | 0.000446 |
| Total Average of 3737~MROM2N2_C2_Vt0 | −0.07507 | −0.00035 |
| Total Average of 3749~MROM2P1_C1_Vt0 | 0.555536 | −0.00061 |
| Total Average of 3753~MROM2P1_C2_Vt0 | 0.279594 | −0.0019 |
| Total Average of 3757~MROM2P1_C3_Vt0 | 0.445167 | 0.000515 |
| Total Average of 3761~MROM2P2_C1_Vt0 | 0.227226 | −0.00045 |
| Average Vt0 | −0.21534 | −0.00044 |

This comparison demonstrates the deleterious effect of the RIE in the process on these features, and, further, the ability of the process without RIE (i.e., the "Via clean with downstream ash" group) to provide acceptable wafers.

Further, it has been determined that the process without RIE is effective in providing less than 20 angstroms of loss of TiN associated with the process. Other advantages in comparison to the RIE plasma photoresist strip process is elimination of that step and a solvent clean step, and, consequently, less money spent on solvents and solvent clean tools.

Apart from the above example, it is noted that at least one prior art reference, U.S. Pat. No. 5,908,319, considered it advantageous to use an aluminum chamber (instead of quartz) in order to assure removal of charged ions from the gas stream prior to contacting the wafer. The method disclosed in U.S. Pat. No. 5,908,319 utilized a first microwave power source to generate a microwave plasma, and, closer to the wafer, an RF source to generate an RIE plasma. The use of an aluminum chamber was stated to assure that there was no electrical charging, and therefore, no electrical damage. However, and advantageously, the methods of the present invention may be practiced in sapphire chambers, or in chambers of other surfaces. This is because there is no RIE plasma generated, and, accordingly, far less likelihood of plasma damage.

While the preferred embodiments of the present invention have been shown and described herein in the present context, such embodiments are provided by way of example only, and not of limitation. Numerous variations, changes and substitutions will occur to those of skilled in the art without departing from the invention herein. For example, the present invention need not be limited to best mode disclosed herein, since other applications can equally benefit from the teachings of the present invention. Accordingly, it is intended that the invention be limited only by the spirit and scope of the appended claims.

What is claimed is:

1. A process for removal of a photoresist layer from a semiconductor wafer in a chamber, comprising:
   a. creating a microwave-energy-generated plasma with no RIE and at a standard temperature, with a first gas mixture comprising oxygen and a fluorine-containing gas, the amount of the fluorine-containing gas sufficient to convert a polymer on side walls of etched features in the wafer to a water soluble form, and contacting the wafer with the microwave-energy-generated plasma;
   b. subsequent to creating, stripping the photoresist layer from the wafer using a microwave-energy-generated plasma of a second gas mixture comprising oxygen and a nitrogen species, and no fluorine-containing gas and without an RIE process and at a relatively high temperature;
   c. determining an endpoint to the stripping of the photoresist layer by a determined change in visible light in the chamber; and
   d. removing the converted polymer with water.

2. The process of claim 1 wherein the stripping comprises creating the microwave-energy-generated plasma in a compartment separate from the wafer, and conveying the microwave-energy-generated plasma to the wafer.

3. The process of claim 1 wherein the change in visible light is a change in light intensity.

4. The process of claim 1 wherein the change in visible light is a change in color.

5. The process of claim 1 wherein the wafer comprises a TiN layer and additionally comprising, after the steps of claim 1, deglazing the TiN layer.

6. The process of claim 5 wherein the deglazing comprises creating a deglazing microwave-energy-generated plasma with no RIE process, with a deglazing gas mixture comprising oxygen and a fluorine-containing gas, and contacting the wafer with the deglazing microwave-energy-generated plasma.

7. A multi-step fabrication method for a semiconductor wafer comprising:
   a. contacting the wafer with a first microwave-generated plasma formed with a first gas mixture comprising oxygen and a fluorine-containing species, the wafer between about 30 and about 50 degrees Celsius, the first microwave-generated plasma being effective to convert the polymer on side walls of etched features in the wafer to a water soluble form;
   b. contacting the wafer with a second microwave-generated plasma formed with a second gas mixture comprising oxygen and a nitrogen species, and no fluorine-containing gas, heating the wafer to about 250 degrees Celsius, the second microwave-generated plasma being effective to remove a photoresist layer from the wafer;
   c. cooling the wafer;
   d. contacting the wafer with a third microwave-generated plasma formed with a third gas mixture comprising oxygen, a nitrogen species, and a fluorine-containing species, the wafer less than about 135 degrees Celsius, and the third microwave-generated plasma being effective to remove oxides from metal surfaces on the wafer; and
   e. removing the converted polymer with water.

8. The method of claim 7, additionally comprising detecting the temperature before step "d" to assure the wafer is less than about 135 degrees Celsius.

9. The method of claim 7, the heating comprising applying heat from a lamp heater disposed above the wafer.

10. The method of claim 7, the fluorine-containing species of the first gas mixture comprising greater than about 4.0 percent and less than about 10.0 percent of the first gas mixture.

* * * * *